US006747794B2

(12) United States Patent
Wang

(10) Patent No.: US 6,747,794 B2
(45) Date of Patent: Jun. 8, 2004

(54) SEMICONDUCTOR OPTICAL AMPLIFIER USING ENERGY FROM SINGLE-TRANSVERSE-MODE VCSELS TO AMPLIFY OPTICAL SIGNAL

(75) Inventor: Shih-Yuan Wang, Palo Alto, CA (US)

(73) Assignee: Gazillion Bits, Inc., San Jose, CA (US)

( * ) Notice: Subject to any disclaimer, the term of this patent is extended or adjusted under 35 U.S.C. 154(b) by 61 days.

(21) Appl. No.: 10/199,658

(22) Filed: Jul. 19, 2002

(65) Prior Publication Data

US 2004/0012845 A1 Jan. 22, 2004

(51) Int. Cl.[7] .................................................. H01S 3/00
(52) U.S. Cl. ....................................................... 359/344
(58) Field of Search ................................... 359/344, 333

(56) References Cited

U.S. PATENT DOCUMENTS 6,597,497 B2 * 7/2003 Wang et al. ................. 359/344

* cited by examiner

Primary Examiner—Mark Hellner
(74) Attorney, Agent, or Firm—Cooper & Dunham LLP

(57) ABSTRACT

A vertically lasing semiconductor optical amplifier (SOA) apparatus for amplifying an optical signal and related methods are described. The SOA comprises an integrated plurality of vertical cavity surface emitting lasers (VCSELs) having a common gain medium layer, and a signal waveguide extending horizontally through the VCSELs near the gain medium layer such that the optical signal is amplified while propagating therethrough. Although integrated onto a common substrate, the VCSELs are functionally isolated from each other, each building up its own distinct lasing field responsive to a distinct electrical pump current therethrough. Each VCSEL is configured and dimensioned to achieve smooth, single transverse mode lasing action for promoting spatially uniform and temporally stable gain of the optical signal as it propagates along the signal waveguide. Preferably, the SOA comprises several dozens to several hundreds of functionally isolated VCSELs, each providing only a small portion of the overall signal gain. If a local defect arises during device fabrication that causes a hot spot or other lasing non-uniformity to occur at nominal bias levels, the spatial and operational scope of that defect is limited to its particular VCSEL, with overall device performance being reduced by only a minor amount.

16 Claims, 11 Drawing Sheets

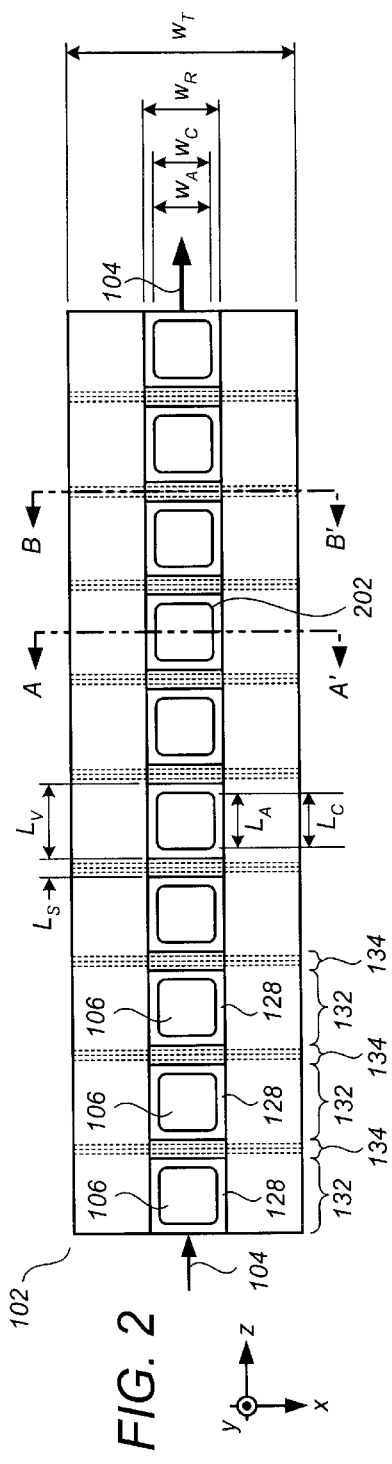
FIG. 2
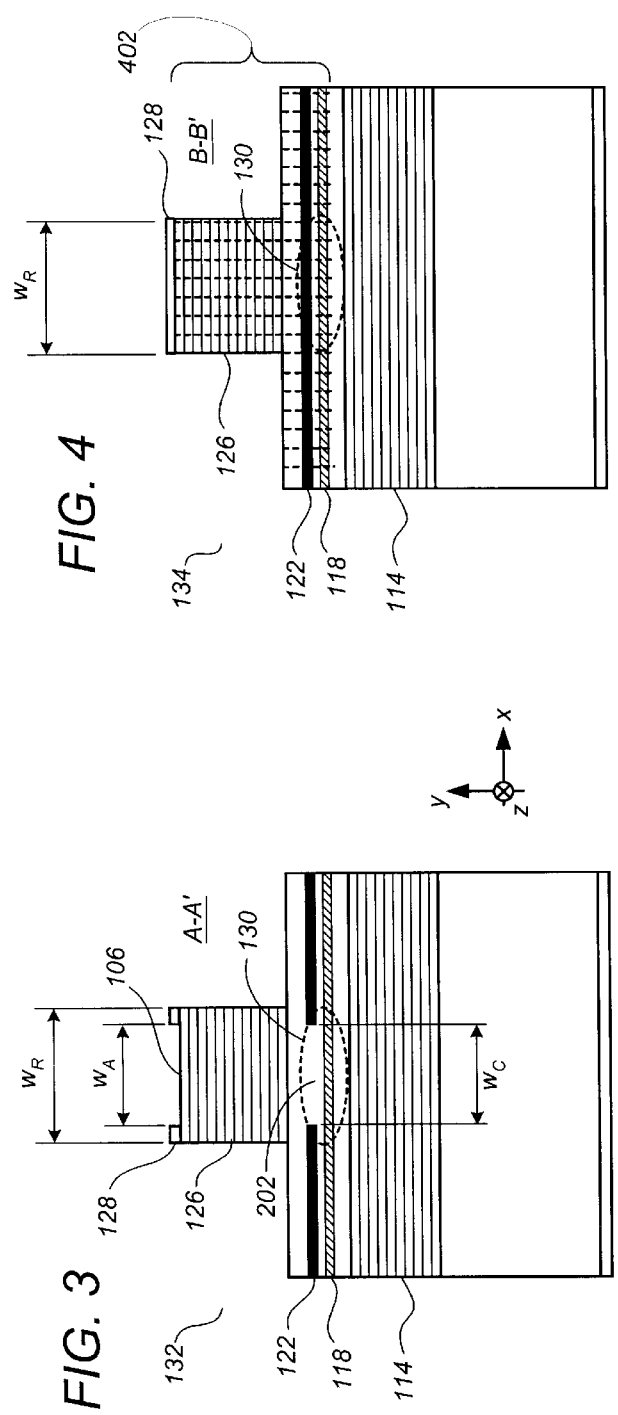
FIG. 4
FIG. 3

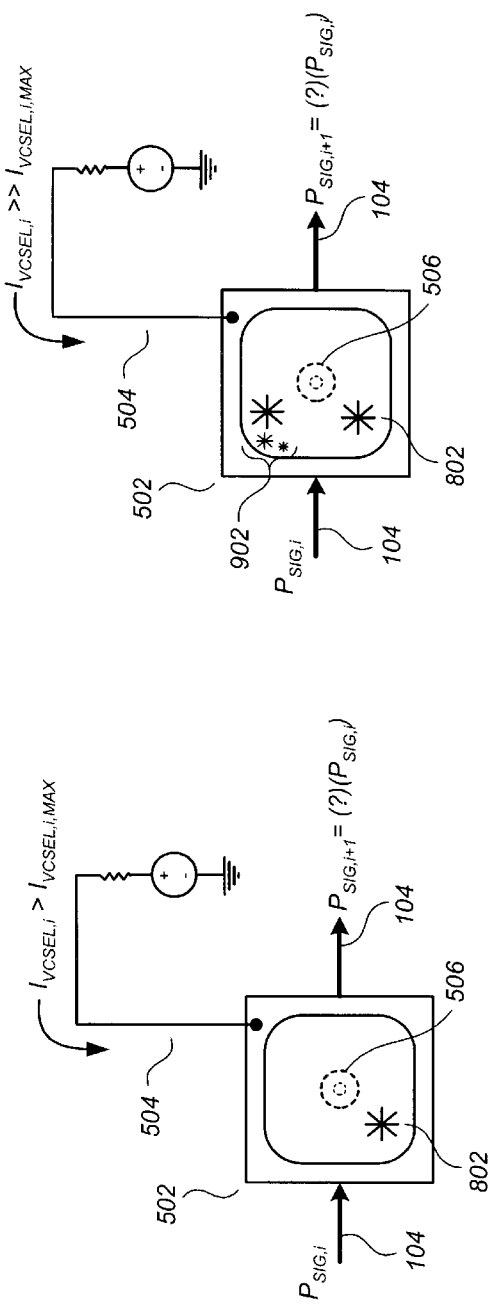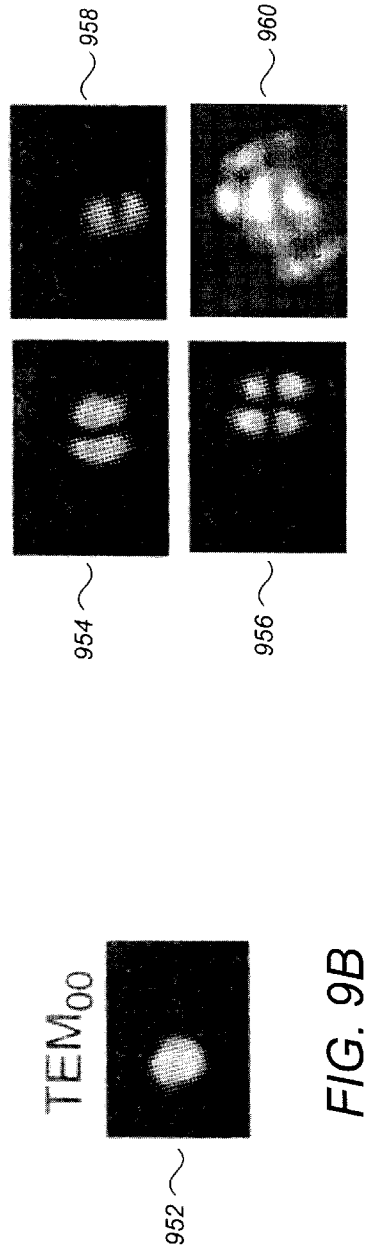
FIG. 9A
FIG. 9C
FIG. 8
FIG. 9B

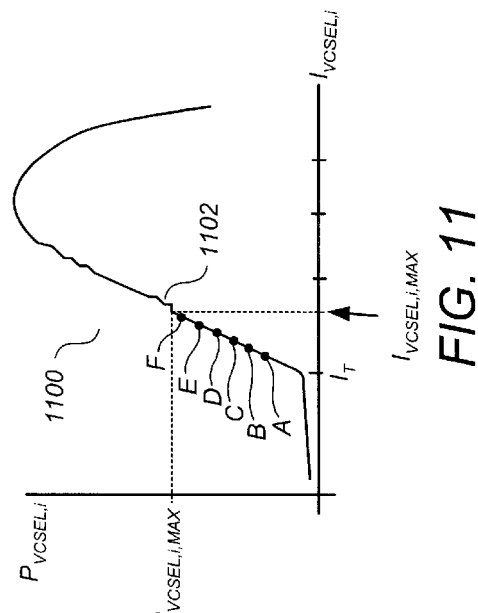
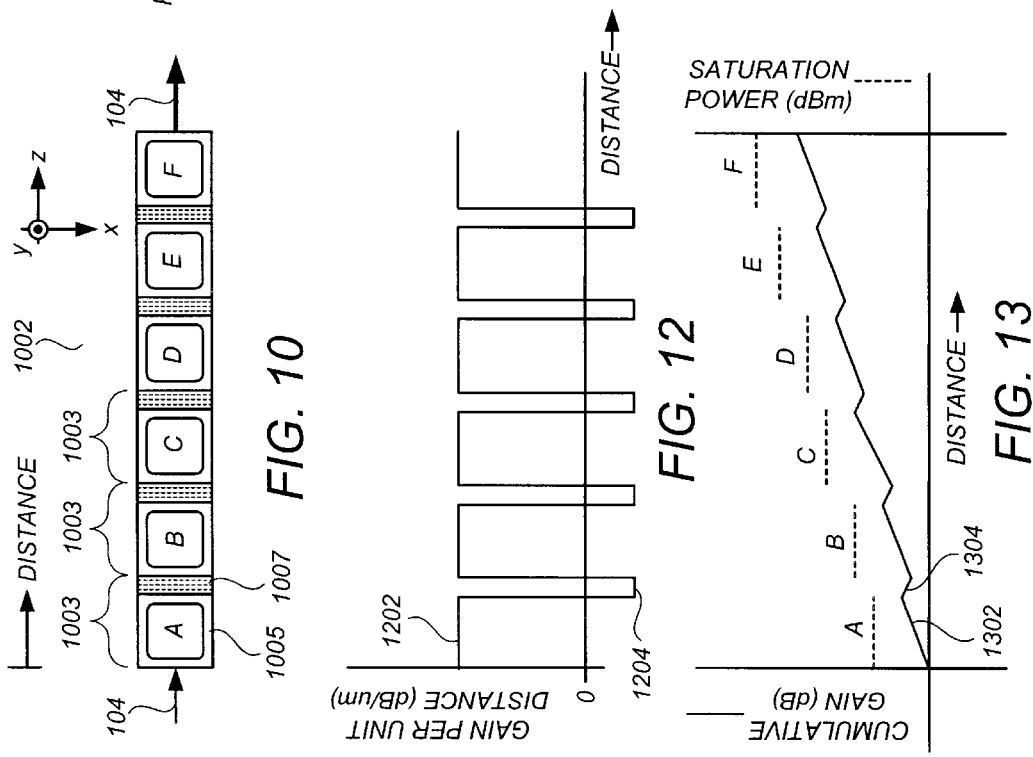

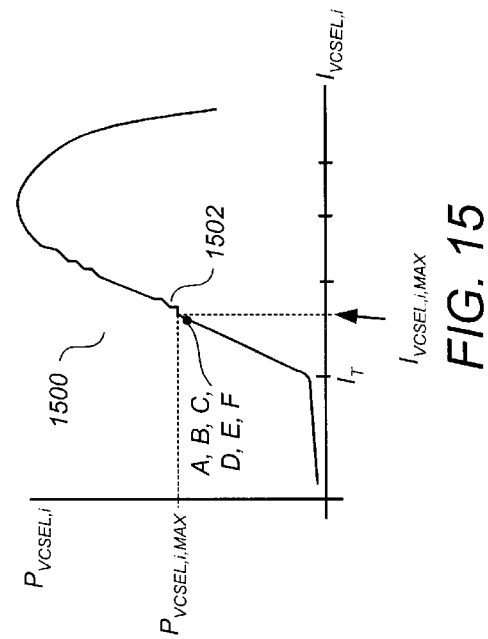
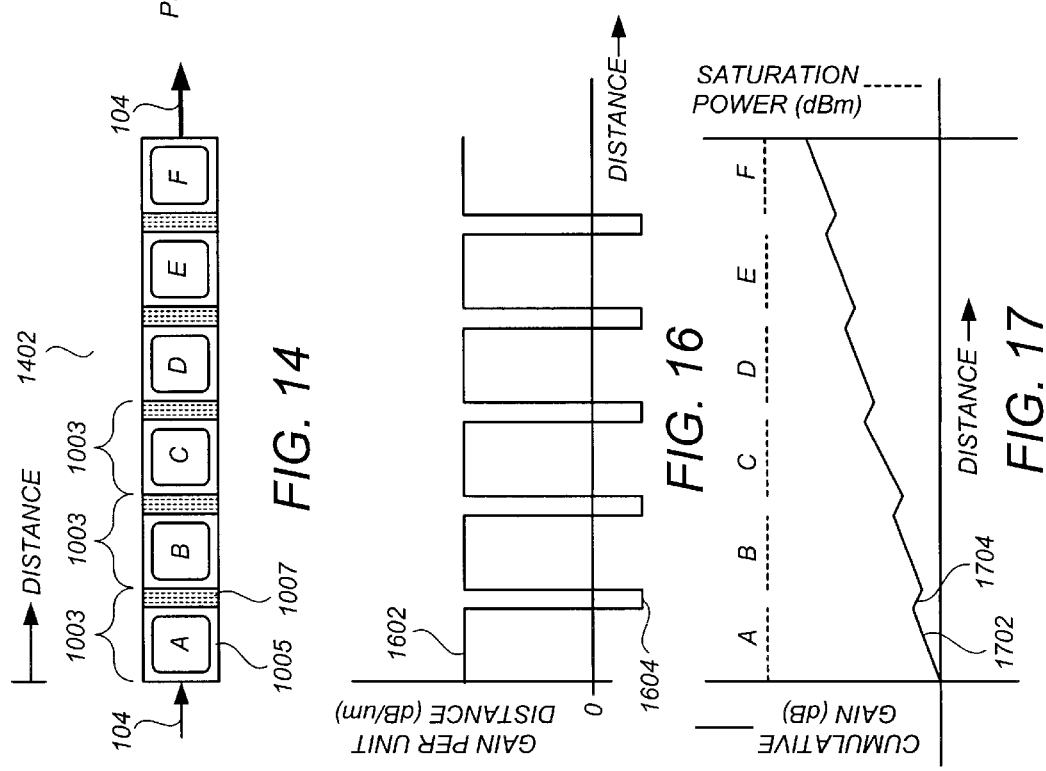

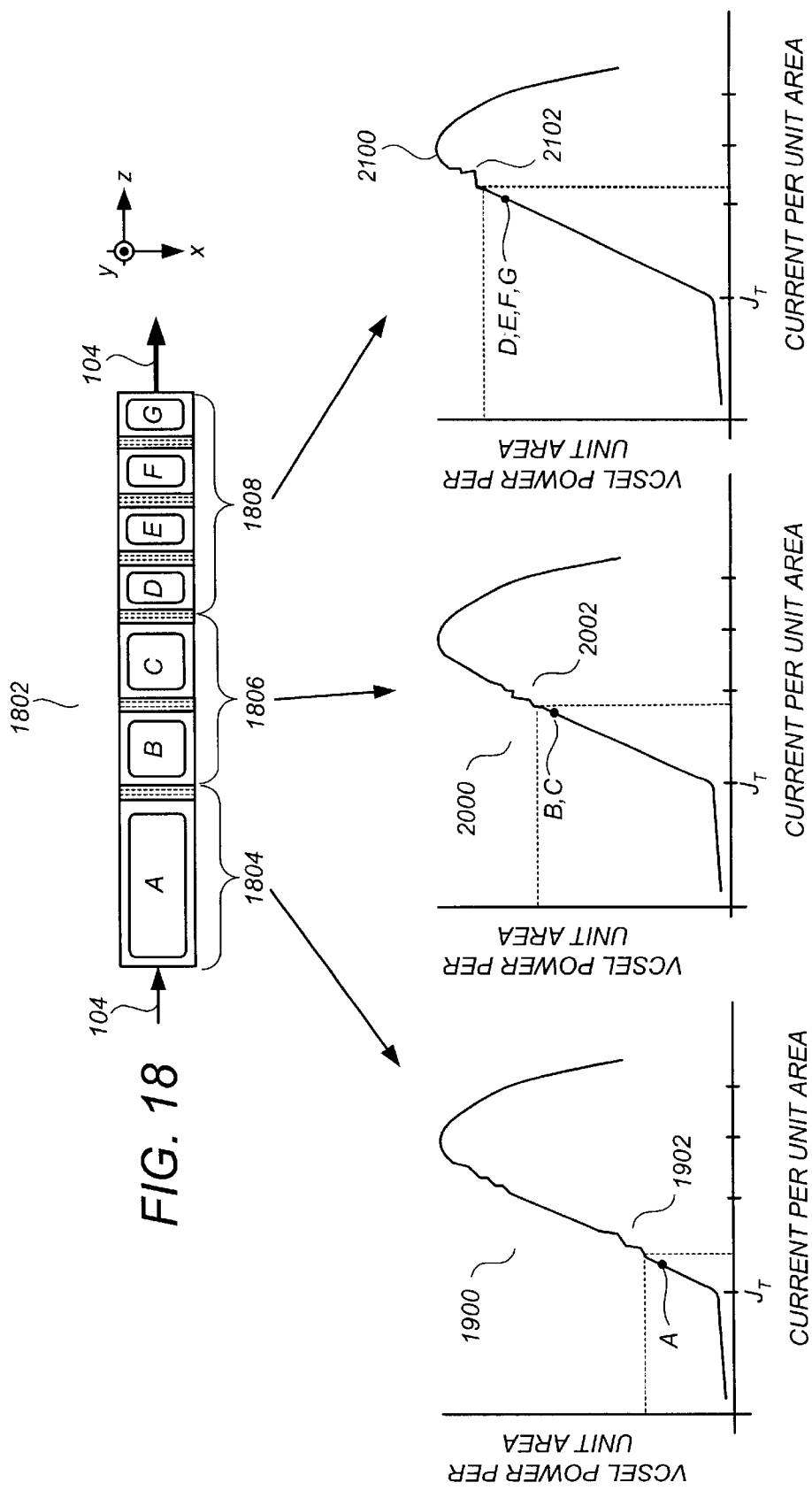

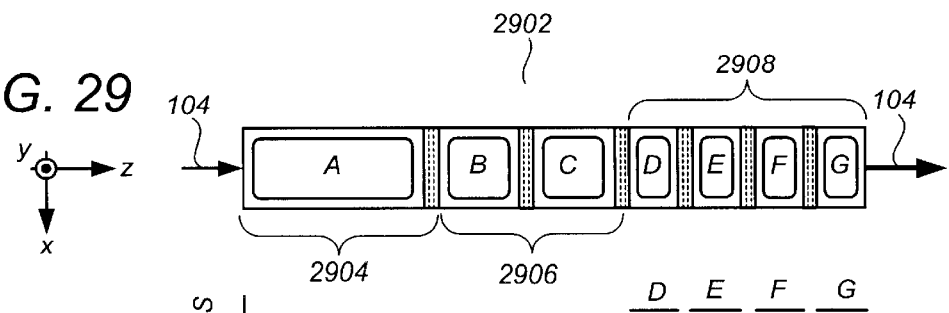
FIG. 29
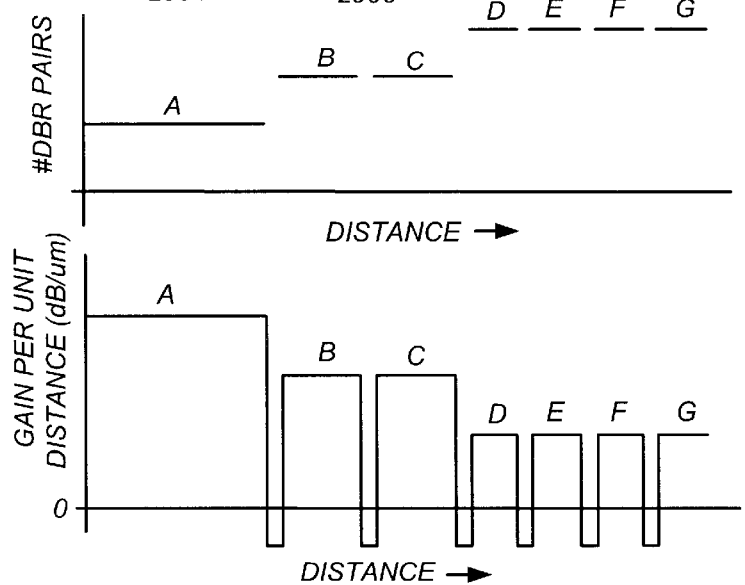
FIG. 30
FIG. 31
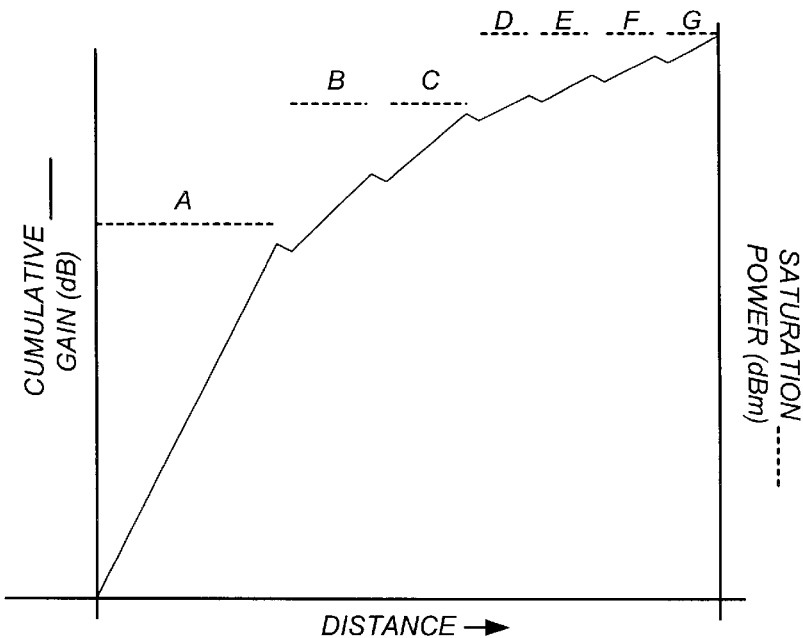
FIG. 32

SEMICONDUCTOR OPTICAL AMPLIFIER USING ENERGY FROM SINGLE-TRANSVERSE-MODE VCSELS TO AMPLIFY OPTICAL SIGNAL

FIELD

This patent specification relates to optical amplifiers. More specifically, it relates to a semiconductor optical amplifier that amplifies an optical signal using energy from vertical cavity surface emitting lasers (VCSELs).

BACKGROUND

As the world's need for communication capacity continues to increase, the use of optical signals to transfer large amounts of information has become increasingly favored over other schemes such as those using twisted copper wires, coaxial cables, or microwave links. Optical communication systems use optical signals to carry information at high speeds over an optical path such as an optical fiber. Optical fiber communication systems are generally immune to electromagnetic interference effects, unlike the other schemes listed above. Furthermore, the silica glass fibers used in fiber optic communication systems are lightweight, comparatively low cost, and are capable of very high-bandwidth operation.

Optical amplifiers are important components of optical communications links. In general, the two primary types of optical amplifiers are optical fiber based amplifiers, such as erbium doped fiber amplifiers (EDFAs) and Raman amplifiers, and semiconductor optical amplifiers (SOAs). EDFAs are widely used in line amplifiers and other applications requiring high output power, high data rates, and low noise. However, EDFAs are quite bulky, having a typical fiber length of about 30 feet, and require the presence of a separate pumping laser to operate. Accordingly, EDFAs are difficult to incorporate into confined spaces and are not amenable to circuit-board-level or chip-level integration.

SOAs, on the other hand, are small in size and conveniently integrated into small devices. However, conventional SOAs generally suffer from pattern-dependent gain fluctuations, which causes crosstalk in multiple-channel optical signals such as those present in wavelength division multiplexed (WDM) networks and dense WDM (DWDM) networks. Amplified spontaneous emission (ASE) noise is another primary troublesome noise source in conventional SOAs. ASE noise arises from random, spontaneous energy state drops in a small fraction of the excited carriers of the gain medium. Efforts continue toward reducing crosstalk effects and ASE noise in SOAs to increase their usefulness in WDM and DWDM networks, and for other applications.

WO 01/28049 (hereinafter the '049 reference) discusses a vertical lasing semiconductor optical amplifier (VLSOA) in which an optical signal travels in a longitudinal direction along an amplifying path, the amplifying path including a semiconductor gain medium, the semiconductor gain medium forming the active medium of a plurality of vertical cavity surface emitting lasers (VCSELs) oriented vertically with respect to the amplifying path. The VCSELs are operated above threshold so as to cause lasing action therein. As the optical signal propagates through the active region, it is amplified by a gain multiplier due to stimulated emission of additional photons. The gain multiplier is substantially constant, i.e., independent of the amplitude of the optical signal, because the laser radiation produced by the VCSELs acts as a ballast to prevent gain saturation.

However, the VLSOA set forth in the '049 reference may experience performance problems due to non-uniformities in the lasing field of the VCSELs. In a non-uniform lasing field, the photon density of the active medium contains undesirable variations that cause the gain experienced by the optical signal to vary, often unpredictably, with time and space within the active medium. One source of such non-uniformity involves the presence of higher-order transverse modes in the vertical cavities, the photon density concentrating in differing spatial patterns depending on which higher-order transverse mode is present. Moreover, when higher-order transverse modes are present, they may be highly unstable. The particular transverse mode dominating at any given instant may vary chaotically with even the smallest variations in excitation current. Operation of the SOA device is compromised in terms of gain multiplier magnitude, gain multiplier stability, and/or saturable power performance.

Another source of non-uniformity in the lasing field arises from practical problems encountered in real-world device fabrication. The growth of "perfect" epitaxial layers being extremely difficult or impermissibly expensive to achieve, real-world devices will have some statistical population of local defects in the semiconductor layers such as crystal dislocations, pitting, voids, etc. Such defects in the epitaxial growth can be a point of lower electrical resistance than the surrounding epitaxial areas. The higher electrical current flowing through these points of lower electrical resistance can create "hot spots" which cause spatially non-uniform currents in the affected areas of the gain medium. The spatially non-uniform currents can adversely affect the lasing action of the VCSEL cavities and cause non-uniform photon densities, again resulting in non-uniform gain and compromised device performance. The area of lasing non-uniformity in the gain medium can extend substantially beyond the immediate region of the local crystal defect. Moreover, the electrical current being funneled through a "hot spot" from the surrounding regions can grow to such a magnitude that overheating and device failure can result.

Accordingly, it would be desirable to provide a vertically lasing semiconductor optical amplifier that is operationally robust in terms of gain multiplier magnitude, gain multiplier temporal stability, and saturable power performance.

It would be further desirable to provide a vertically lasing semiconductor optical amplifier having increased tolerance to local defects that may occur in the epitaxial growth stages of device fabrication.

SUMMARY

A semiconductor optical amplifier (SOA) apparatus and related methods are provided for amplifying an optical signal, the SOA comprising an integrated plurality of vertical cavity surface emitting lasers (VCSELs) having a common gain medium layer, the SOA further comprising a signal waveguide extending horizontally through the VCSELs near the gain medium layer such that the optical signal is amplified while propagating therethrough, wherein each VCSEL is configured and dimensioned to achieve smooth, single-transverse-mode lasing action for promoting spatially uniform and temporally stable gain of the optical signal as it propagates along the signal waveguide. Although integrated onto a common substrate, the VCSELs are functionally isolated from each other, each building up its own distinct lasing field responsive to a distinct electrical pump current therethrough. Each VCSEL is configured and dimensioned to suppress higher order or otherwise uneven lasing modes at nominal bias levels. When each VCSEL is achieving smooth, single-transverse-mode lasing action at its nominal bias levels, the current density in the gain medium is even and temporally stable, thereby resulting in spatially uniform and temporally stable amplification of the optical signal.

According to a preferred embodiment, neighboring VCSELs are functionally isolated from each other by separation zones formed by electrically isolating implants. Preferably, the SOA comprises several dozens to several hundreds of functionally isolated VCSELs positioned along the optical signal path, the gain medium of each VCSEL providing only a small portion of the overall signal gain. Advantageously, if a local defect arises during device fabrication that causes a "hot spot" to occur or that otherwise causes uneven lasing to occur at nominal bias levels, the spatial and operational scope of that defect is limited to its particular VCSEL. Furthermore, because that VCSEL is associated with only a small percentage of the overall signal gain, it is more likely that there will be only minor implications for overall device performance due to that local defect. According to one preferred embodiment, the VCSEL containing the local defect is operated at a lower bias level sufficient for gain medium transparency. According to another preferred embodiment, the bias level of that VCSEL is set to the lesser of (a) a nominal bias level for that VCSEL, or (b) a uniformity threshold bias level above which multi-transverse-mode or otherwise uneven lasing action is observed to occur in that VCSEL.

In one preferred embodiment, the plurality of VCSELs are positioned in a longitudinal array extending from an input end to an output end of the SOA, the VCSELs lasing vertically relative to the optical signal path that extends from the input end to the output end. Each VCSEL comprises a vertical arrangement of material layers including a set of lower distributed Bragg reflector (DBR) layers, a lower cladding layer, an active layer coextensive with the SOA gain medium layer, a current confinement layer defining a current aperture, an upper cladding layer, and a set of upper DBR layers. The signal waveguide is defined vertically by the upper cladding layer, the gain medium layer, and the lower cladding layer. The signal waveguide is defined laterally by a lateral confinement ridge formed at least in part by the upper DBR layers and extending from the input end to the output end of the longitudinal array of VCSELs.

According to one preferred embodiment, the separation zones that separate neighboring VCSELs are formed by electrically isolating implants that extend through the upper DBR layers, the upper cladding layer, and the gain medium layer. To reduce optical signal attenuation in the separation zones, their length is kept to a minimum amount that is still sufficient to isolate the neighboring VCSELs, which in one preferred embodiment is between about 1 $\mu$m and 2 $\mu$m. In another preferred embodiment, the gain medium is disordered in the separation zones to further reduce attenuation of the optical signal. In still another preferred embodiment, the electrical resistivity profile of the separation zones is manipulated so as to allow a small amount of pump current into the gain medium layer, thereby providing a degree of transparency thereto and reducing optical signal losses in the separation zones.

According to a preferred embodiment, to ensure single transverse mode lasing at nominal bias levels, the horizontal dimensions of each VCSEL are kept below predetermined lengths (in the direction of signal propagation) and predetermined widths (perpendicular to the direction of signal propagation) appropriate for the material system used and the wavelengths of device operation. For example, in one preferred embodiment, the current aperture length and output aperture length are each kept below about 10 $\mu$m, and the current aperture width and output aperture width are also each kept below about 10 $\mu$m. Preferably, the output aperture and the current aperture are roughly the same size. However, a variety of aperture shapes, aspect ratios, and dimensions are within the scope of the preferred embodiments that provide smooth, single-transverse-mode lasing action at nominal bias levels.

BRIEF DESCRIPTION OF THE DRAWINGS

FIG. 2 illustrates a top view of the vertically lasing SOA of FIG. 1;

FIG. 3 illustrates a side cutaway view of the vertically lasing SOA of FIG. 1;

FIG. 4 illustrates a side cutaway view of the vertically lasing SOA of FIG. 1;

FIGS. 8–9A illustrate simplified top views of electrical biasing and corresponding lasing action of a single-VCSEL portion of a vertically lasing SOA;

FIGS. 9B–9C illustrate images of VCSEL output intensities;

FIG. 10 illustrates top view of a vertically lasing SOA according to a preferred embodiment;

FIG. 11 illustrates a conceptual plot of laser power output versus bias current for each VCSEL of the vertically lasing SOA of FIG. 10 including particular bias points thereon;

FIGS. 12–13 illustrate conceptual plots of gain per unit distance, cumulative gain, and saturable power versus distance corresponding to the vertically lasing SOA of FIG. 10 and bias points thereof according to FIG. 11;

FIG. 14 illustrates a top view of a vertically lasing SOA according to a preferred embodiment;

FIG. 15 illustrates a conceptual plot of laser power output versus bias current for each VCSEL of the vertically lasing SOA of FIG. 14 including particular bias points thereon;

FIGS. 16–17 illustrate conceptual plots of gain per unit distance, cumulative gain, and saturable power versus distance corresponding to the vertically lasing SOA of FIG. 14 and bias points thereof according to FIG. 15;

FIG. 18 illustrates a top view of a vertically lasing SOA according to a preferred embodiment;

FIGS. 19–21 illustrate conceptual plots of laser output power density versus bias current density for respective VCSEL groups of the vertically lasing SOA of FIG. 18 including particular bias points thereon;

FIG. 29 illustrates a top view of a vertically lasing SOA according to a preferred embodiment;

FIG. 30 illustrates a conceptual plot of the number of pairs of distributed Bragg reflector (DBR) mirrors of the different VCSELs of the vertically lasing SOA of FIG. 29;

FIGS. 31–32 illustrate conceptual plots of gain per unit distance, cumulative gain, and saturable power versus distance corresponding to the vertically lasing SOA of FIG. 29;

DESCRIPTION

Figure 1:
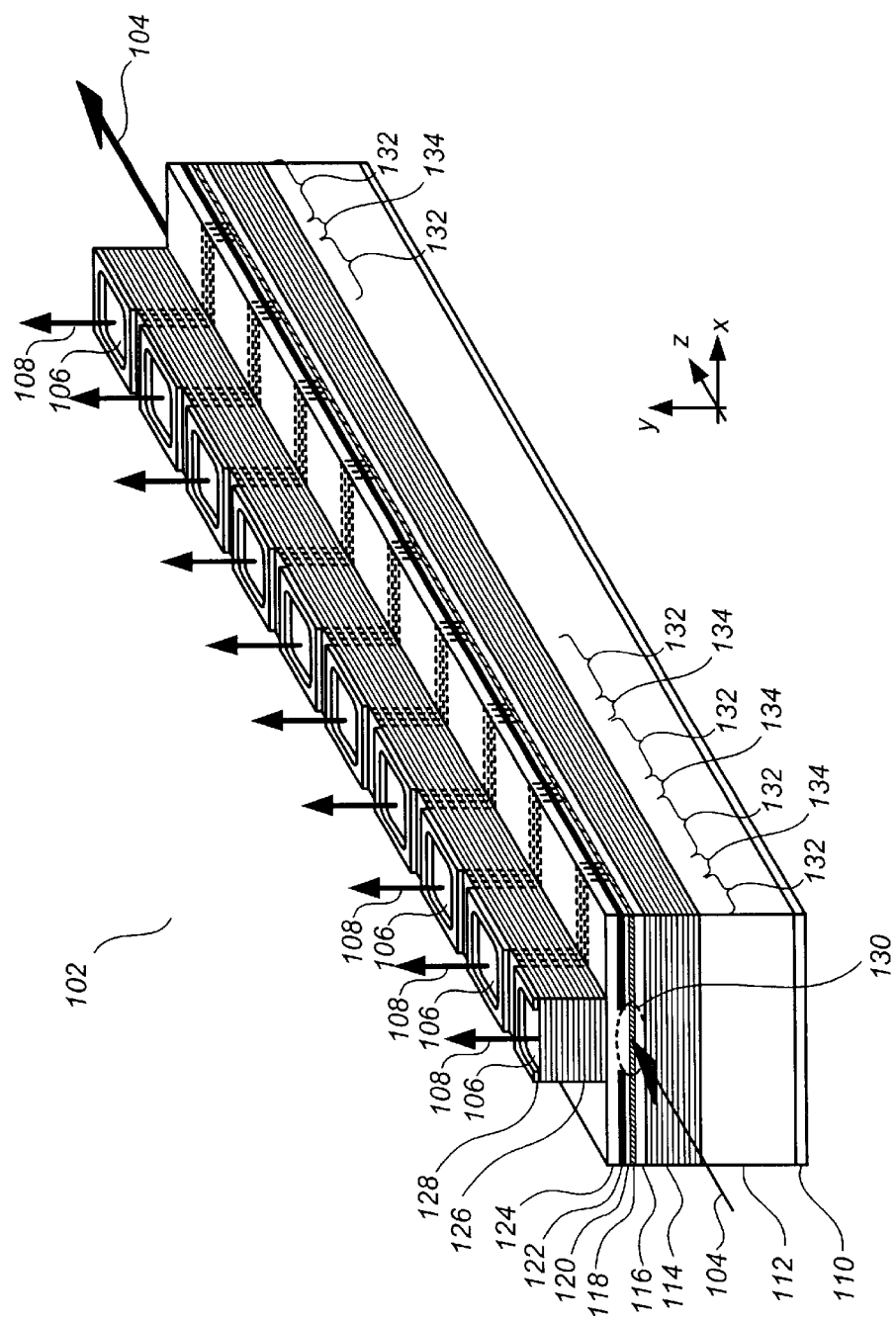
FIG. 1 illustrates a perspective view of a vertically lasing semiconductor optical amplifier (SOA) according to a preferred embodiment.

FIG. 1 illustrates a simplified perspective view of a vertically lasing semiconductor optical amplifier (SOA) 102 according to a preferred embodiment, the SOA 102 for guiding an optical signal 104 between an input and an output while also amplifying the optical signal 104. SOA 102 comprises a plurality of vertical cavity surface emitting lasers (VCSELs) 132 integrated onto a common substrate 112 and sharing a common gain medium layer 118. The VCSELs 132 are longitudinally arranged in the "z" direction of FIG. 1 such that their material layers form a signal waveguide 130 that guides the optical signal 104 from the input to the output. Preferably, antireflective coatings (not shown) are provided at the input and outputs such that backward reflections of the optical signal 104 are prevented. Each VCSEL 132 comprises an output aperture 106 for emitting laser light 108. The laser light 108 may alternatively be referred to as excitation laser light or pump laser light, because it is associated with a lasing action that exists primarily for the purpose of establishing a population inversion used to amplify a different optical signal 104. The VCSELs 132 may be referred to as ballast VCSELs because the lasing action therein acts as a ballast to prevent gain saturation in the amplification of the optical signal 104. The laser light 108 itself remains generally unused.

Formed upon the substrate 112, each VCSEL 132 comprises a lower distributed Bragg reflector (DBR) layer 114, a lower cladding layer 116, the gain medium layer 118, an upper cladding layer 120/124, a current confinement layer 122, an upper DBR layer 126, and an upper ohmic contact 128. The upper cladding layer 120/124 includes a primary portion 124 above the current confinement layer, and optionally includes a thin secondary portion 120 lying between the current confinement layer and the gain medium layer 118 for allowing a small amount of current spreading during VCSEL operation. A lower ohmic contact 110 is provided beneath the substrate 112. The gain medium layer 118 has a higher index of refraction than the neighboring upper and lower cladding layers, thereby providing for vertical confinement (in the "y" direction of FIG. 1) of the optical signal 104 as it propagates in the longitudinal direction (the "z" direction of FIG. 1) from the input to the output. The upper DBR layer 126 forms a ridge rising above the upper cladding layer 124 extending from the input to the output, providing for lateral confinement (in the "x" direction of FIG. 1). Some degree of lateral confinement is also provided by virtue of current apertures (not shown in FIG. 1) formed within the current confinement layer 122, which are illustrated further infra.

Importantly, the VCSELs 132 are functionally distinct and are designed to achieve lasing action independently of one another. Separation zones 134 formed by electrically isolating implants are provided between neighboring VCSELs 132 so that the neighboring VCSELs are functionally isolated from each other. By functionally isolated, it is meant that two neighboring VCSELs may be provided with two distinct electrical pump currents, and when so provided the lasing status of each VCSEL is a substantially exclusive function of its own electrical pump current, and is substantially independent of on the presence or absence of the pump current and lasing action in the neighboring VCSEL.

For preferred embodiments in which the VCSELs 132 are top-emitting, as in the example of FIG. 1, the upper layers of neighboring VCSELs are substantially electrically isolated from each other. The substantial mutual electrical isolation between neighboring VCSELs should extend from their upper ohmic contacts down through at least their gain medium layers. To achieve this in the example of FIG. 1, the electrically isolating implants in the separation zones 134, indicated by the dotted lines in FIG. 1, extend from the top surface of the DBR layers 126 down through the gain medium layer 118. The upper ohmic contacts 128 are electrically separated by trenches and/or by the electrically isolating implant. In view of the present specification, similar electrical isolation mechanisms for bottom-emitting VCSELs and other VCSEL types will be readily apparent to one skilled in the art, and are within the scope of the preferred embodiments.

As will be described in several examples infra, it may be desirable to externally group adjacent VCSELs together by connecting their upper ohmic contacts to a common electrical node. This may be achieved using external electrical circuitry, or by adding integrated circuit layers onto the top and/or sides of the VCSEL structures shown in FIG. 1. In these circumstances it is to be appreciated that, although wired to common external electrical nodes, the neighboring VCSELs are still considered to be electrically and functionally isolated as those terms are used herein, because the material layers of the neighboring VCSELs relevant to their operation do not interact with each other across the separation zones 134.

In operation, each of the VCSELs 132 is pumped above its lasing threshold so that lasing action occurs therein, and the optical signal 104 is introduced into the input of the SOA 102. According to a preferred embodiment, the VCSELs 132 are configured and dimensioned to achieve smooth, single-transverse-mode lasing action at nominal bias levels above threshold. This can be evidenced when viewing the emitted pump laser light 108 from above the SOA 102 using a microscope or other analogous VCSEL output-monitoring device. For each VCSEL 132, the pump laser light 108 should have a smooth, single-transverse-mode distribution across the output aperture 106. The smooth, single-transverse-mode distribution should correspond to the fundamental (T00) transverse mode, and should be free from any concentrations of light (hot spots), free from all higher order (i.e., non-T00) transverse modes, and should remain constant over time. A nonlimiting example of a smooth, single-transverse-mode output is shown in FIG. 9B, infra. In one preferred embodiment, if hot spots, multiple transverse modes, or other uneven lasing is observed for a given VCSEL, the bias level is reduced for that VCSEL until smooth, single-transverse-mode lasing is observed. It is generally not desirable to reduce the bias level below a gain medium transparency level, as excessive losses in the optical signal 104 may be incurred.

In general, it is preferable that the output aperture should be roughly the same size or larger than the current aperture, although some degree of variation is acceptable. If the output aperture is substantially smaller than the current aperture, e.g., less than half the size of the current aperture, the observation of a smooth, single-transverse-mode output intensity might not always guarantee that truly single-mode lasing action is occurring within the laser cavity, i.e., that there is even current distribution across the entire current aperture and a substantially uniform gain across the entire gain region. If there is a very small output aperture compared to the current aperture, the presence of smooth, single-transverse-mode output pattern would indicate the presence of even current and photon densities in the gain medium directly beneath the output aperture, but the current and photon densities may still be misbehaving at other locations of the current aperture not directly beneath the current aperture. Conversely, where the output aperture is roughly the same size or larger than the current aperture, the achievement of a smooth, single-transverse-mode output intensity pattern is necessarily indicative of the presence of an even current distribution across the entire current aperture and a substantially uniform gain across the entire gain region. It is to be appreciated, as one skilled in the art would readily recognize, that the desired even current distribution and photon densities in the gain medium will not be precise, exact "flat-top" lines when plotted versus distance; there can be some small rolling variations of their plots even when the desired smooth, single-transverse-mode output intensity is achieved. However, there will advantageously be a lack of severe local variations in the current distribution and the photon densities as would accompany the "misbehaving" cases of FIG. 9C, for example. Moreover, whereas the "misbehaving" cases of FIG. 9C can also be accompanied by temporally unstable current distribution and photon densities in the gain medium, the presence of a smooth, single-transverse-mode output intensity pattern necessarily indicates that they are temporally stable.

Advantageously, due to the electrical and functional separation of the VCSELs, any lasing non-uniformities due to local defects in one VCSEL will usually affect only that VCSEL, and will not affect neighboring VCSELs. While the conceptual example of FIG. 1 shows only ten (10) VCSELs 132, there are preferably dozens to hundreds of such VCSELs positioned along the optical signal path, as will be described further infra, with each VCSEL providing only a small portion of the overall gain of the optical signal 104. Accordingly, if a local defect arises during device fabrication that requires a bias level reduction in one of the VCSELs 132, it is likely that there will be only minor implications for overall device performance. Indeed, in an alternative preferred embodiment, the problematic VCSEL can be left at its nominal bias level to lase in its uneven fashion, provided that the pump current is not so excessive as to cause device failure. In another preferred embodiment, a current-limiting scheme is used such that, if the pump current is excessive at the nominal bias voltage, that bias voltage is reduced until the nominal pump current is achieved.

FIG. 2 illustrates a top view of the vertically lasing SOA 102 of FIG. 1. FIG. 3 illustrates a cross-sectional view of the vertically lasing SOA 102 in a plane A-A' intersecting a VCSEL portion 132 thereof. FIG. 4 illustrates a cross-sectional view of the vertically lasing SOA 102 in a plane B-B' intersecting a separation zone portion 134 thereof. Shown in FIGS. 2 and 3 is a current aperture 202 that, in the particular preferred embodiment shown, is similar in shape to the output aperture 106. The current aperture 106 has a generally rectangular shape when viewed from above. When compared to an alternative embodiment in which a circular current aperture is used, the generally rectangular shape of the current aperture 106 facilitates a larger lasing volume and a more uniform cross-section as seen by the optical signal 104. The current aperture 106 is rounded near its corners to avoid the presence of high electrical fields associated with sharp corners, further promoting smooth, uniform lasing action.

Shown by dotted lines in FIG. 4 is an electrically isolating implant region 402 corresponding to the separation zones 134 of FIGS. 1–2. To achieve sufficient electrical isolation, the electrically isolating implant should extend at least down through the gain medium layer 118. To reduce attenuation of the optical signal 104 in the separation zones 134, their length $L_S$ (in the direction of optical signal propagation) is kept to a minimum amount that is still sufficient to isolate the neighboring VCSELs 132, which in one preferred embodiment is between about 1 $\mu$m and 2 $\mu$m. In another preferred embodiment, the gain medium 118 is disordered in the separation zones 134 to further reduce attenuation of the optical signal 104. In still another preferred embodiment, the electrical resistivity profile of the implanted region 402 in the separation zones 134 is tailored so as to allow a small amount of pump current into the gain medium layer 118 in the separation zones 134, thereby providing a degree of transparency to the gain medium layer 118 in the separation zones 134 and reducing optical signal losses therein. The electrical resistivity profile when viewed in the x-z plane is analogous to that described in the commonly assigned U.S. Ser. No. 10/006,435, filed on Dec. 4, 2001, which is incorporated by reference herein.

Fabrication of the SOA 102 is similar in many respects to the fabrication of conventional linear VCSEL arrays. Generally speaking, any of a variety of VCSEL structures designed for smooth, single-transverse-mode lasing action may be used, provided that they can establish and accommodate the signal waveguide 130 and, preferably, propagation of a single-mode WDM signal along the signal waveguide 130. Particular VCSEL structures and/or fabrication methods that may be suitable are described in: Babic et. al., "Long-Wavelength Vertical-Cavity Lasers," from *Vertical Cavity Surface Emitting Lasers: Design, Fabrication, Characterization, and Applications*, Wilmsen et. al., eds., Cambridge University Press (1999), at Chapter 8; Seurin et. al., "Novel VCSEL Designs Deliver High Single-Mode Output Power," Laser Focus World, May 2002, pp. 119–122; Cheng, J., "VCSEL-Based Technologies for Multi-Dimensional Optical Interconnects and Multi-Access Networks," Chapter 5 of Cheng and Dutta, eds., *Vertical-Cavity Surface-Emitting Lasers: Technology and Applications*, Vol. 10 *of Optoelectronic Properties of Semiconductors and Superlattices*, Manasreh, ed., Gordon and Breach Science Publishers (2000); and the commonly assigned U.S. Ser. No. 09/927,802 filed Aug. 10, 2001, each of which is incorporated by reference herein.

Generally speaking, common fabrication techniques include organometallic vapor phase epitaxy (OMVPE), organometallic chemical vapor deposition (OMCVD), molecular beam epitaxy (MBE), liquid phase epitaxy (LPE), photolithography, e-beam evaporation, sputter deposition, wet and dry etching, wafer bonding, ion implantation, wet oxidation, and rapid thermal annealing, among others. The gain medium layer 118 may comprise a multiple quantum well (MQW) structure including several quantum wells, which provides an advantage that relatively low threshold currents can yield sufficient lasing action. MQW structures include InAlGaAs on InP substrates, InGaAsP on InP, GaIn-NAs on GaAs, InGaAs on ternary substrates, and GaAsSb on GaAs. Alternatively, the gain medium layer 118 may comprise a single quantum well or a double-heterostructure active region. The particular choice of materials for the gain medium layer 118 depends at least in part on the wavelength of the optical signal to be amplified and on the composition of the other material layers.

By way of example, in one particular preferred embodiment the substrate 112 comprises GaAs, the lower DBR mirrors 114 comprises alternating layers of n-doped AlGaAs/GaAs, the lower cladding layer 116 comprises n-doped GaAs, the gain medium layer 118 comprises multiple quantum wells of InGaAsN/InGaAs, the upper cladding layer 120/124 comprises p-doped GaAs, and the upper DBR mirrors comprise alternating layers of p-doped AlGaAs/GaAs. During device fabrication the lower DBR mirrors 114, the lower cladding layer 116, the gain medium layer 118, and a uniform upper cladding layer are formed upon the substrate 112 using known methods. Prior to formation of the upper DBR layers, a buried oxygen implantation process is performed in which oxygen atoms are buried in the upper cladding layer so as to form the current confinement layer 122 including the current confinement aperture 202. The use of oxygen implantation provides the ability to fine-tune the particular shape of the current aperture 202 in a manner that avoids sharp edges or corners, thereby facilitating smooth, uniform lasing action of the VCSEL cavity. The oxygen implantation process results in a segregation of the previously uniform upper cladding layer into a lower cladding layer portion 120, an upper cladding portion 124, and the current confinement layer 122 therebetween, the current confinement layer 122 in turn being segregated into a non-oxygen-implanted, conducting current aperture 202 and a non-conducting, oxygen-implanted region laterally surrounding the current aperture 202. As known in the art, the oxygen-implanted region surrounding the current aperture becomes non-conducting due to a carrier compensation effect.

Subsequent to the oxygen implantation process, the upper DBR mirrors are formed above the upper cladding layer 124, and then an electrically isolating proton implantation process is used to form the separation zones 132. The implanted region 402 preferably extends from the surface of the DBR down to at least the gain medium layer 118. After this step, a vertical etching process is used to etch down the outer portions of the upper DBR layers so as to form the ridge element that provides lateral confinement for the optical signal 104.

By way of example only, and not by way of limitation, one set of dimensions known to encourage smooth, single-transverse-mode lasing action in the VCSELs 132 includes a VCSEL length $L_V$ of about 10 $\mu$m, a ridge width $w_R$ of about 10 $\mu$m, a current aperture length $L_C$ of about 8 $\mu$m, a current aperture width $w_C$ of about 8 $\mu$m, an output aperture length $L_A$ of about 8 $\mu$m, and an output aperture width $W_A$ of about 8 $\mu$m. The length $L_S$ of the separation zones 134, as described supra, is preferably small, e.g., about 1 $\mu$m. The overall width $w_T$ of the SOA 132 may be about 30 $\mu$m. Preferably, there are several dozen to several hundred of the VCSELs 132, each providing only an incremental amount of gain for the optical signal 104. In one example in which there are 50 VCSELs, the overall length of the SOA 102 would be about 550 $\mu$m (0.55 mm). In another example in which there are 500 VCSELs, the overall length of the SOA 102 would be about 5500 $\mu$m (5.50 mm).

Again by way of example and not by way of limitation, one set of thicknesses that may be typical of the material layers includes a substrate thickness of about 250 $\mu$m, a lower and upper DBR thickness of about 3 $\mu$m–6 $\mu$m, a gain medium thickness of about 0.1 $\mu$m, and a current confinement layer thickness of about 0.1 $\mu$m. The lower cladding layer 116 may have a thickness of about 1 $\mu$m, the upper portion 124 of the upper cladding layer may have a thickness of about 1 $\mu$m, and the lower portion 120 of the upper cladding layer may have a thickness of about 0.1 $\mu$m. It is to be appreciated, however, that these figures are presented by way of example only to assist in providing a clear description of the preferred embodiments, and that a variety of different numerical ranges are within the scope of the preferred embodiments depending on the VCSEL structures used, the material systems used, and the wavelengths of operation.

In other preferred embodiments consistent with InP-based material systems, it may be necessary to use higher-efficiency DBR mirrors comprising alternating layers of dielectric materials such $SiO_2/Si$ or other amorphous materials. In these cases, because such DBR materials are generally non-conducting, the upper ohmic contact 128 should be formed to one or both sides of the upper DBR ridge, and a conducting path around the lower DBR should also be established. Examples of such structures are described in U.S. Ser. No. 09/927,802, supra. For these devices, the electrically isolating implants that electrically separate neighboring VCSELs can be performed prior to the formation of the upper DBR mirror layers. One skilled in the art would be readily able to adapt these and other fabrication methods described herein to any of a variety of different types of VCSEL architectures, the resulting devices being within the scope of the preferred embodiments.

Figures 5, 6, 7:
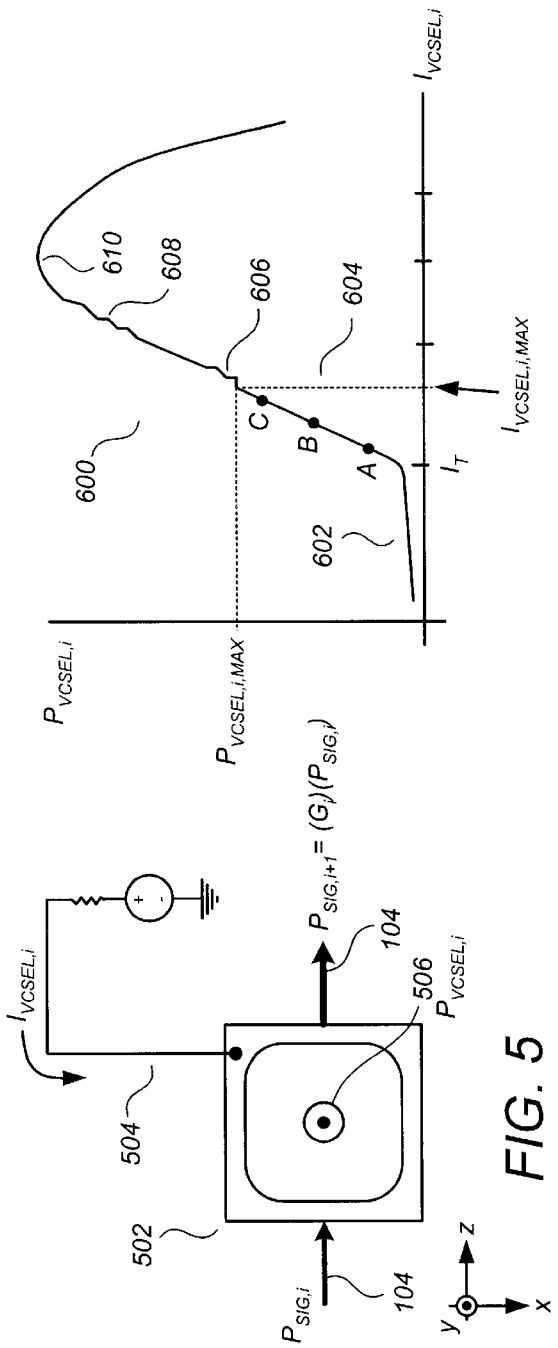
FIG. 5 illustrates a simplified top view of electrical biasing and corresponding lasing action of a single-VCSEL portion of a vertically lasing SOA according to a preferred embodiment.
FIG. 6 illustrates a conceptual plot of laser power output versus bias current for the single-VCSEL portion of FIG. 5.
FIG. 7 illustrates a conceptual plot of optical signal gain versus output optical signal power for an optical signal propagating through the single-VCSEL portion of FIG. 5 at different operating points.

FIG. 5 illustrates a simplified conceptual top view of an $i^{th}$ VCSEL 502 as seen by the optical signal 104 as it propagates down a vertically lasing SOA according to a preferred embodiment. A bias source 504 modeled as a voltage source with an internal resistance provides an above-threshold current $I_{VCSEL,i}$, and a single-mode lasing field denoted by the single upward arrow 506 in the "y" direction and having a laser output power of $P_{VCSEL,i}$ results. The optical signal 104 travels in the longitudinal "z" direction in FIG. 5, having a power $P_{SIG,i}$ as it enters the gain medium of the VCSEL 502 and having a power $P_{SIG,i+1}$ as it exits the gain medium of the VCSEL 502, with $P_{SIG,i+1}$ being equal to $P_{SIG,i}$ times a gain factor $G_i$ that is clamped to a substantially constant value independent of the magnitude of $P_{SIG,i+1}$ provided that a saturable power $P_{SAT}$ has not been exceeded. It is to be appreciated that the lasing field of the VCSEL 502 indicated by the upward arrow 506 does not have a concentration near the center of the VCSEL as the arrow by itself might suggest. Rather, the single upward arrow 506 in the center of the aperture represents a smooth, single-transverse-mode output intensity across the output aperture. By way of nonlimiting example, FIG. 9B illustrates an image 952 of the output of a smooth, single-transverse-mode VCSEL output when viewed from above. One skilled in the art will readily recognize, however, that certain other intensity images of smooth, single-transverse-mode VCSEL outputs may not look exactly like FIG. 9B, such as when the shape of the aperture is more rectangular, for example. The image 952 is taken from Seurin et. al., supra.

FIG. 6 illustrates a conceptual bias curve 600 of laser output power $P_{VCSEL,i}$ versus bias current $I_{VCSEL,i}$ for the $i^{th}$ VCSEL 502 of FIG. 5. FIG. 7 illustrates conceptual plots of the optical signal gain $G_i$ versus output optical signal power $P_{SIG,i+1}$ at different bias points. It is to be appreciated that the bias curve 600 and gain curve 700 are conceptual curves presented for illustrating the methods, features, and advantages of the preferred embodiments, and, while indicative of the major features of actual VCSEL bias curves and gain curves, are not necessarily to scale.

Generally stated, the VCSEL 502 lases in a desirably smooth, single-transverse-mode manner when operated above a lasing threshold and below a certain maximum bias level and output lasing power, herein termed a uniformity threshold. In accordance with a preferred embodiment, it is desirable to bias the VCSEL 502 in this region so that a substantially spatially uniform and stable population inversion is provided in the gain medium layer that results in a substantially spatially uniform and stable amplification of the optical signal 104. Above the uniformity threshold, the VCSEL beings to "misbehave" through the presence of higher-order transverse modes and/or through the presence of hot spots due to local material defects in the VCSEL structure, and the lasing field is be spatially smooth and uniform. Generally speaking, if the VCSEL has very high-quality, defect-free material layers, the initial source of the lasing non-uniformities as the bias level is increased is due to a breakout of higher order transverse modes. If the VCSEL possesses a sufficient number and/or severity of material defects, then the initial source of the lasing non-uniformities as the bias level is increased is due to the ascension of hot spots. These two undesirable effects may also be coupled to each other, e.g., as the bias level is increased the ascension of a hot spot may in turn lead to the early arrival of higher-order transverse modes. According to a preferred embodiment, the bias level of each VCSEL in a vertically lasing SOA is maintained above a lasing threshold and below a uniformity threshold for that VCSEL.

Bias curve 600 comprises a non-lasing region of operation 602 when the bias current $I_{VCSEL,i}$ is below a threshold current $I_T$, and a single-transverse-mode lasing region 604 when the bias current $I_{VCSEL,i}$ is above the threshold current $I_T$ and below a bias current uniformity threshold $I_{VCSEL,i,MAX}$. As the bias current $I_{VCSEL,i}$ is increased above the bias current uniformity threshold $I_{VCSEL,i,MAX}$ the curve experiences a kink 606 in which the output power varies in an unstable manner with increased bias current. Generally speaking, the kink 606 corresponds to the above-described departure from smooth, single-transverse-mode lasing action as the bias current is increased above the uniformity threshold.

FIGS. 8–9A illustrate conceptual views of the lasing action taking place in the VCSEL 502 at different operating points above the uniformity threshold. In FIG. 8 the symbol 802 represents, for example, a single hot spot that has ascended into prominence above the uniformity threshold. In FIG. 9A the additional symbols 902 represent, for example, additional current non-uniformities and modal instabilities as the bias current continues to increase.

By way of nonlimiting example, FIG. 9C illustrates images 954, 956, 958, and 960 of VCSEL outputs that are not of the smooth, single-transverse mode variety. In contrast with the "well-behaved" smooth, single-transverse-mode output shown in FIG. 9B, the outputs of FIG. 9C are not "well-behaved," having higher-order modes (images 954, 956, and 958) or a combination of higher-order modes and otherwise uneven lasing action (image 960). Plots 954, 956, and 958 are taken from Seurin et. al., supra at p. 119, while plot 960 is taken from Cheng, supra, at p. 195.

Referring back to FIG. 6, one or more additional kinks 608 usually occur if the bias current continues to increase. For completeness of description, a power peak 610 is also shown in FIG. 6, beyond which the laser output power begins to decrease as a spectral overlap between DBR mirror reflectivity and active region gain begins to wane. However, for smooth, single-transverse-mode lasing action, the bias current $I_{VCSEL,i}$ will generally need to remain well below this level. Generally speaking, the bias current uniformity threshold $I_{VCSEL,i,MAX}$ is expected to lie somewhere between two to five times the lasing threshold current $I_T$, although the scope of the preferred embodiments is not so limited. Shown in FIGS. 6 and 7 are particular bias points A, B, and C on the bias curve 600 and corresponding gain curves 700A, 700B, and 700C. As illustrated in FIG. 7, the basic gain amount $G_i$ is about the same for all three bias points A–C, but the saturable power level increases as the bias level is increased within the desired region of operation 604.

According to a preferred embodiment, different VCSELs of the vertically lasing SOA 102 may be biased at different points to achieve desired performance characteristics relating to gain, noise, saturable powers, and the like. By way of example, VCSELs located near the input of the SOA 102 may be biased nearer to the operating point A because they do not need a high saturable power, while VCSELs located near the output of the SOA 102 may be biased nearer to the operating point C because they need the higher saturable power. Upon reading the present disclosure, a person skilled in the art would be readily able to develop any of a variety of SOA design strategies relating to ballast VCSEL size, shape, and bias points for achieving different gain, noise, and saturable power performances, several of such strategies being described infra.

FIG. 10 illustrates top view of a vertically lasing SOA 1002 according to a preferred embodiment comprising multiple identical amplifying segments 1003. Each amplifying segment 1003 comprises a VCSEL 1005 and a separation zone 1007 except for the final amplifying segment, which comprises a VCSEL only. Although there are only six (6) amplifying segments 1003 shown in the embodiment of FIG. 10 for clarity of presentation, there are preferably dozens to hundreds of such amplifying segments 1003 positioned along the path of the optical signal 104, with each VCSEL providing only a small portion of the overall gain. Superimposed on the VCSELs 1005 of FIG. 10 are markers A–F used to differentiate their respective bias levels as described infra.

FIG. 11 illustrates a conceptual plot of a bias curve 1100 for the vertically lasing SOA 1002 of FIG. 10. As indicated thereon, each VCSEL 1005 is biased below the bias current uniformity threshold $I_{VCSEL,i,max}$, which is presumed to be identical for each VCSEL 1005 for simplicity and clarity of description, and below the first kink 1102 of the bias curve 1100. The bias points A–F are at successively higher levels above the lasing threshold $I_T$ and below the uniformity threshold $I_{VCSEL,i,max}$.

FIG. 12 illustrates a plot of gain per unit distance versus distance for the vertically lasing SOA 1002 of FIG. 10 when biased at the bias points A–F of FIG. 11. As indicated there, each VCSEL 1005 is associated with a positive gain per unit distance metric 1202, while each separation zone 1007 is associated with a negative gain per unit distance. Because the VCSELs themselves are presumed to be identical in this example, the positive gain per unit distance for each VCSEL 1005 is the same for all bias points A–F.

FIG. 13 illustrates a plot of cumulative gain versus distance for the vertically lasing SOA of FIG. 10 when biased at the bias points A–F of FIG. 11. Also shown for each VCSEL is a dotted line corresponding to the saturable output power $P_{SAT}$ for that VCSEL for the optical signal 104 as it exits that VCSEL in the longitudinal "z" direction. As indicated in FIG. 13, the cumulative gain rises linearly (in dB) with distance within each VCSEL 1005 as indicated in the regions 1302, and decreases linearly (in dB) with distance within each separation zone 1007. When configured and operated according to a preferred embodiment, each amplification segment 1003 yields a positive net signal gain because optical signal gain incurred in the VCSEL portion 1005 provides more gain than the optical signal loss incurred in the separation zone 1007. While the gains for each VCSEL are the same because the VCSELs themselves are the same, the saturable powers increase from A–F because of the increased bias level for operating points A–F. According to a preferred embodiment, the nominal bias levels are sufficient to result in a saturable power for any given VCSEL 1005 that is greater than the largest expected power of the optical signal 104 as it leaves that VCSEL.

FIGS. 14–17 illustrate a VCSEL 1402 and associated operational plots analogous to those of FIGS. 10–13, respectively. However, in this example all VCSELs are biased at identical bias levels A–F, as indicated in FIG. 15. As indicated in FIGS. 16–17, operation is generally the same except that the saturable powers of the respective VCSELs are the same. According to this preferred embodiment, the nominal bias levels are sufficient to result in a saturable power for any given VCSEL 1005 that is greater than the largest expected output power of the vertically lasing SOA 1402. It is to be appreciated that one skilled in the art, in view of the present disclosure, could readily develop any of a variety of biasing strategies for achieving different noise and saturable power performances. Generally speaking, although many different factors can come into play that affect noise performance, it is generally expected that the noise performance of the embodiment of FIG. 10 will be somewhat better than the noise performance for the embodiment of FIG. 14. However, the embodiment of FIG. 14 is expected to be generally easier to implement since all bias points are the same, thus allowing the electrical driving circuitry of the device to be simpler.

FIG. 18 illustrates a top view of a vertically lasing SOA 1802 according to a preferred embodiment in which an aspect ratio, used herein to denote a ratio of the longitudinal dimension (in the "z" direction) of a VCSEL current aperture to a lateral dimension (in the "x" direction) of the VCSEL current aperture, is designed to become progressively smaller with increasing longitudinal distance. Thus, in a first VCSEL group 1804, the VCSELs have an aspect ratio greater than unity. In a second VCSEL group 1806 the VCSELs have an aspect ratio about equal to unity. In a third VCSEL group 1808, the VCSELs have an aspect ratio less than unity. In other preferred embodiments, all of the aspect ratios are less than unity, but the later VCSELs nearer to the optical signal output have lesser aspect ratios than the earlier VCSELs nearer to the input. Generally speaking, presuming that the lateral dimensions of the VCSELs (i.e., in the "x" direction) are equal, those VCSELs having smaller aspect ratios can be driven "harder" on a per-area basis than the VCSELs having larger aspect ratios before smooth, single-transverse-mode lasing begins to break down. According to a preferred embodiment, the aspect ratios of the ballast VCSELs can be strategically selected, along with strategic selection of biasing levels, for achieving different gain, noise, and saturable power performances.

FIGS. 19–21 illustrate bias curves 1900, 2000, and 2100, respectively, corresponding to the different VCSEL groups of the vertically lasing SOA 1802 of FIG. 18, normalized to a per-area basis by plotting emitted pump laser power per unit area (power density) versus current per unit area (current density). Generally speaking, other factors being equal, the bias current density uniformity threshold will be higher for those VCSELs having smaller aspect ratios than those having larger aspect ratios, as reflected by the later emergence of kinks 1902, 2002, and 2102 on the bias curves 1900, 2000, and 2100, respectively. Accordingly, the bias levels B–C for the second VCSEL group 1806 can be higher on a per unit area basis than the bias level A for the first VCSEL group 1804, and the bias levels D–G for the third VCSEL group 1808 can be still higher on a per unit area basis.

Figure 22:
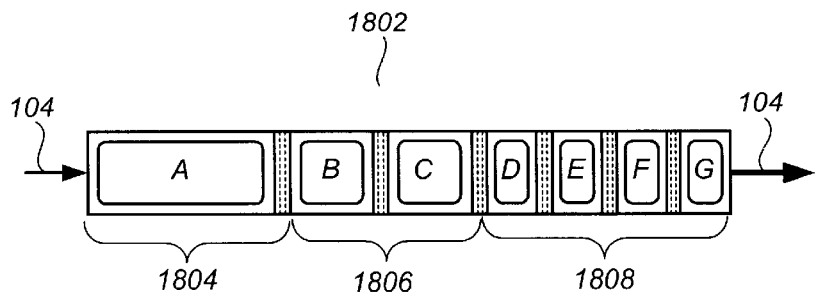
FIG. 22 illustrates a top view of a vertically lasing SOA according to a preferred embodiment similar to that of FIG. 18.
Figure 23:
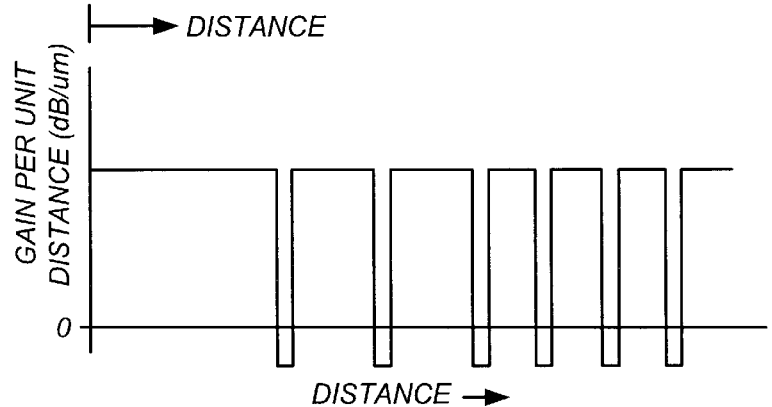
FIGS. 23–24 illustrate conceptual plots of gain per unit distance, cumulative gain, and saturable power versus distance corresponding to the vertically lasing SOA of FIG. 22 and bias points thereof according to FIGS. 19–21.
Figure 24:
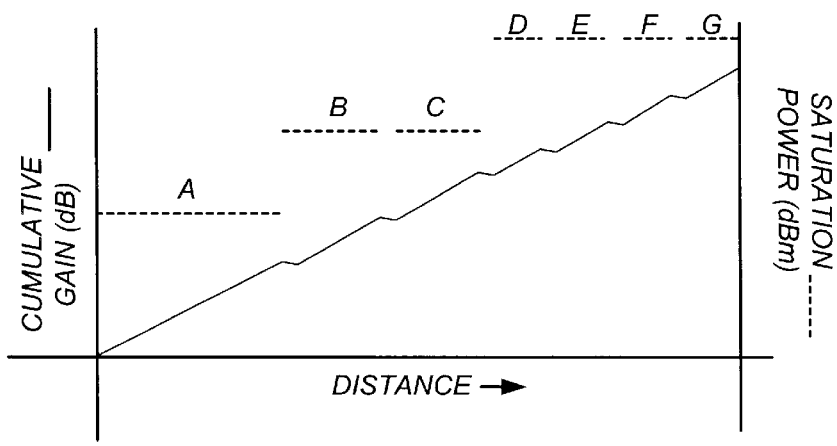

FIGS. 22 illustrates a top view of the vertically lasing SOA 1802 of FIG. 18, and FIGS. 23–24 illustrate conceptual plots of gain per unit distance, cumulative gain, and saturable power versus distance corresponding to the bias points A–G of FIGS. 19–21. Because the VCSELs of FIG. 18 are presumed for simplicity to be identical except for their aspect ratios, the gains per unit distance are roughly same for the different VCSEL groups and operating points A–G. However, the saturable power increases as the bias current per unit area is increased, with beneficial implications for noise performance as compared to a scenario in which all of the VCSELs are equally biased on a per-area basis.

Figure 25:
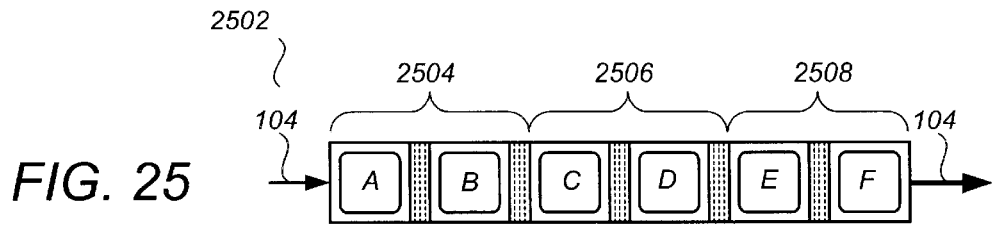
FIG. 25 illustrates a top view of a vertically lasing SOA according to a preferred embodiment.
Figure 26:
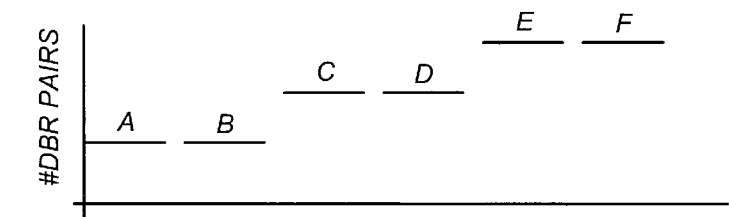
FIG. 26 illustrates a conceptual plot of the number of pairs of distributed Bragg reflector (DBR) mirrors of the different VCSELs of the vertically lasing SOA of FIG. 25.
Figure 27:
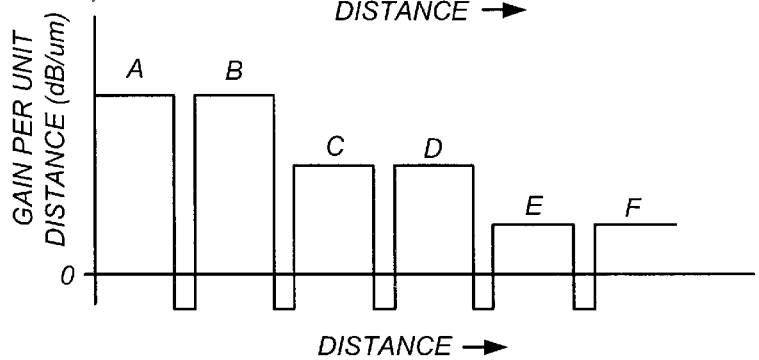
FIGS. 27–28 illustrate conceptual plots of gain per unit distance, cumulative gain, and saturable power versus distance corresponding to the vertically lasing SOA of FIG. 25.
Figure 28:
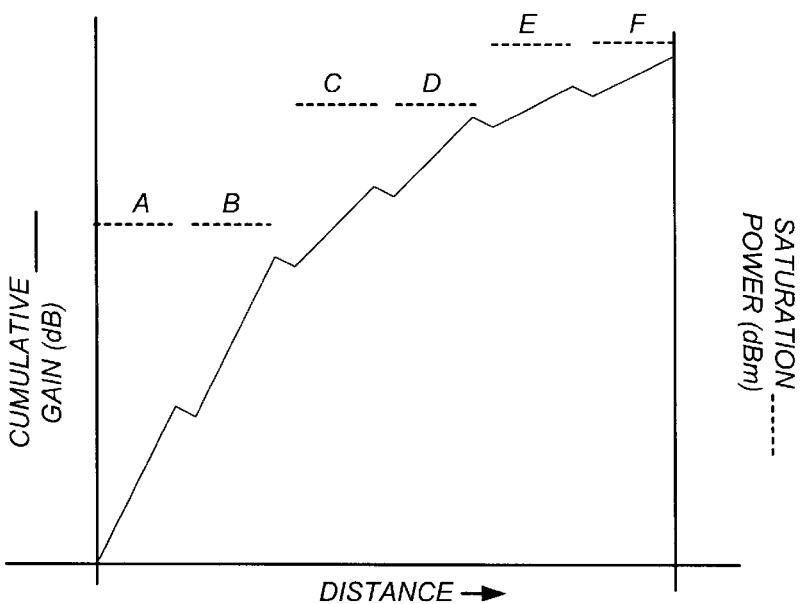

FIG. 25 illustrates a top view of a vertically lasing SOA 2502 according to a preferred embodiment that is similar to the vertically lasing SOA 1802 of FIG. 18, with the exception that the number of VCSEL DBR mirror pairs is varied for different VCSEL groups 2504, 2506, and 2508 as indicated in FIG. 26. FIGS. 27–28 illustrate conceptual plots of gain per unit distance, cumulative gain, and saturable power versus distance for the vertically lasing SOA 2502. Generally speaking, other factors being equal, those VCSELs having fewer pairs of DBR mirrors will result in a higher gain per unit distance that those VCSELs having a greater number of pairs of DBR mirrors, because the necessary photon density required to achieve lasing action is greater. According to a preferred embodiment, the number of DBR mirror pairs of the VCSELs can be strategically selected, along with strategic selection of biasing levels, for achieving different gain, noise, and saturable power performances.

Because of the different numbers of DBR mirror pairs, the biasing curves and the biasing points A–E for the different VCSEL groups of FIG. 25 are generally not comparable to each other. However, in accordance with a preferred embodiment, the earlier VCSELs nearer to the input are biased proportionally closer to their lasing thresholds, and farther away from their lasing uniformity thresholds, than the VCSELs nearer to the output, for achieving improved noise performance.

FIG. 29 illustrates top view of a vertically lasing SOA 2902 according to a preferred embodiment. FIGS. 30 illustrates a conceptual plot of the number of DBR pairs per VCSEL for the vertically lasing SOA 2902. FIGS. 31–32 illustrate conceptual plots of gain per unit distance, cumulative gain, and saturable power versus distance for the vertically lasing SOA 2902. According to a preferred embodiment, both the number of DBR mirror pairs and the aspect ratios of the VCSELs can be strategically selected, along with strategic selection of biasing levels, for achieving different gain, noise, and saturable power performances. For superior noise performance, the preferred embodiment of FIGS. 29–32 employs (i) a greater number of mirrors and smaller aspect ratios for those VCSELs nearer to the output to accommodate higher saturable powers with lesser optical signal gain, while employing (ii) fewer mirror pairs and greater aspect ratios nearer to the input for accommodating higher optical signal gain with lesser saturable powers.

Figure 33:
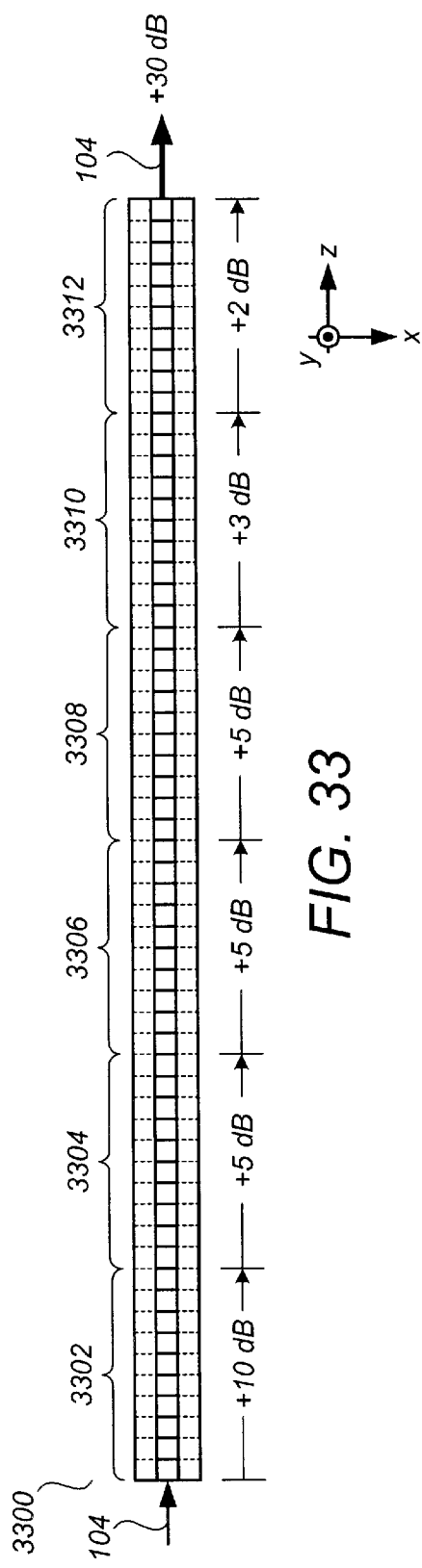
FIG. 33 illustrates a top view of a vertically lasing SOA according to a preferred embodiment.

FIG. 33 illustrates a top view of a vertically lasing SOA 3300 according to a preferred embodiment, along with an example of a gain distribution according to a preferred embodiment. SOA 3300 comprises 60 VCSELs arranged in 6 groups 3302–3312 according to their gains, which are +10 dB, +5 dB, +5 dB, +5 dB, +3 dB, and +2 dB, respectively, for a total signal gain of +30 dB. The VCSELs of all groups 3302–3312 have similar dimensions, e.g., 10 μm×10 μm in the longitudinal ("z") and lateral ("x") directions, respectively, and comprise differing numbers of DBR mirrors to achieve their different gains. Each VCSEL only contributes a modest amount of gain, ranging from +1 dB per VCSEL in VCSEL group 3302 to +0.2 dB in VCSEL group 3312. By way of example, the overall length of the device, is about 660 μm where it is presumed that the separation zones between VCSELs are about 1 μm in length.

Advantageously, if a local defect arises during fabrication that causes a "hot spot" or otherwise uneven lasing to occur in one of the VCSELs at nominal bias levels, the spatial and operational scope of that defect is limited to its particular VCSEL. Furthermore, because that VCSEL is associated with only a small percentage of the overall signal gain, it is more likely that there will be only minor implications for overall device performance due to that local defect. The partially-defective VCSEL can be affirmatively turned down to a transparency level during device testing, or can be automatically current-limited by external electrical circuitry during device operation. Alternatively, if excessive current drain is not involved, the partially-defective VCSEL can simply be operated at nominal levels, there being a substantially likelihood that the overall device can remain within overall operating parameters because of the relatively minor contribution of that VCSEL.

Figure 34:
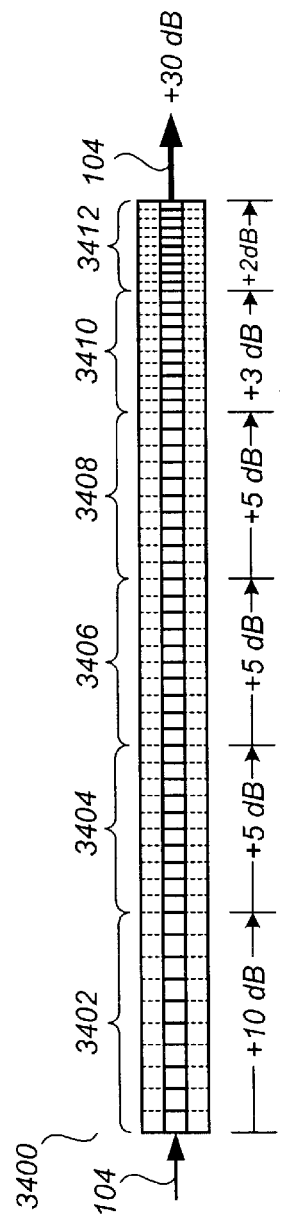
FIG. 34 illustrates a top view of a vertically lasing SOA according to a preferred embodiment.

FIG. 34 illustrates a top view of a vertically lasing SOA 3400 according to a preferred embodiment, again comprising 60 VCSELs arranged in 6 groups 3402–3412 according to their gains, which are +10 dB, +5 dB, +5 dB, +5 dB, +3 dB, and +2 dB, respectively, for a total signal gain of +30 dB. However, unlike the preferred embodiment of FIG. 33, in the preferred embodiment of FIG. 34 the number of DBR mirrors is the same for all of the VCSELs, and gain per VCSEL is varied by varying the longitudinal lengths of each VCSEL in proportion to their gain contribution. This has the inherent advantage of decreasing the aspect ratios of the VCSELs nearer to the output of the device, which, as described supra with respect to FIGS. 18–21, allows for higher per-unit-area biasing and higher saturable power levels for those VCSELs nearer to the output of the device.

Whereas many alterations and modifications of the present invention will no doubt become apparent to a person of ordinary skill in the art after having read the foregoing description, it is to be understood that the particular embodiments shown and described by way of illustration are in no way intended to be considered limiting. For example, while current confinement described in the preferred embodiments supra was achieved by proton implantation, in other preferred embodiments current confinement may be achieved by p-n blocking, Fe doping, or other methods. By way of further example, although the preferred embodiments are described supra in terms of electrical pumping of the laser gain medium, the scope of the preferred embodiments is not so limited. The gain medium may alternatively be optically pumped, wherein a light flux is introduced into the gain medium to achieve a population inversion. There are also other known methods that may be used for pumping, including chemical pumping where the population is achieved chemically, and other methods. Because gain-clamped amplification greatly facilitates the use of multilevel or n-ary data encoding schemes (n>2), within the scope of the preferred embodiments is a multilevel data communications system comprising at least one vertically lasing SOA in which signal amplification energy is provided VCSEL lasing fields.

By way of further example, the preferred embodiments described herein are readily applied in the context of a ballast-powered SOA in which the ballast lasers are edge-emitting lasers. Thus, for example, in U.S. Ser. No. 10/006, 435, supra, the transverse edge-emitting ballast lasers are preferably configured and dimensioned to achieve smooth, single-mode lasing such that those portions intersecting or passing near the signal waveguide provide a temporally stable, spatially uniform gain for the optical signal. This may be achieved by ensuring that the edge-emitting ballast lasers are generally long and thin. By way of example and not by way of limitation, where the transverse edge-emitting ballast lasers have cavity lengths between mirrors in the range of about 30 μm to 100 μm or greater, the widths of the edge-emitting ballast lasers are preferably about 10 μm or less.

By way of further example, while the optical signal gain resulting from a given VCSEL is varied supra by using different numbers of DBR mirror pairs, any of a variety of other methods that vary the round-trip losses in the VCSEL lasing cavity can be used to adjust the optical signal gain. Examples include ion implantation adjustment, temperature adjustment, variation by an applied voltage, by mechanical deformation or tilting of the mirror, by horizontal displacement of the mirror, by incorporating a variably absorbing liquid crystal layer in the cavity, or by some other mechanism. By way of further example, the distances between separation zones, i.e., the longitudinal dimensions of the respective VCSELs, can be randomized or otherwise varied so that back-reflections associated with small refractive index differences at the separation zones do not build up.

By way of further example, although one or more of the preferred embodiments supra is described in terms of an output aperture having a size similar to that of its current aperture, in another preferred embodiment the spirit of the present invention is extensible to a ballast-powered SOA in which the ballast cavity does not actually emit laser light, but otherwise provides a stable, high-photon-density gain medium for providing gain-clamped amplification of an optical signal. In such case, the ballast cavity is similar to the ballast lasers supra except that a reflective surface is placed at the output aperture such that no laser light is emitted even there is resonance occurring inside the cavity. Therefore, reference to the details of the preferred embodiments is not intended to limit their scope, which is to be limited only by the following claims.

What is claimed is:

1. A semiconductor optical amplifier, comprising:
  a signal waveguide for guiding an optical signal, said signal waveguide including a gain medium layer; and a plurality of vertical cavity surface emitting lasers (VCSELs) intersecting said signal waveguide, each VCSEL having an active layer integral with said gain medium layer, each VCSEL having a lasing direction substantially perpendicular to said gain medium layer, the optical signal being amplified as it propagates along said signal waveguide while said VCSELs are lasing;

wherein said VCSELs are each configured and dimensioned to achieve smooth, single-transverse-mode lasing action at nominal bias levels to promote temporally stable and spatially uniform amplification of the optical signal as it propagates along said signal waveguide.

2. The semiconductor optical amplifier of claim 1, each of said VCSELs comprising a current aperture near said gain medium configured and dimensioned to promote a substantially even current distribution through said gain medium over an area corresponding to said current aperture.

3. The semiconductor optical amplifier of claim 2, each of said VCSELs comprising an output aperture not substantially smaller than said current aperture, each of said VCSELs generating pump light in said lasing direction, said smooth, single-transverse-mode lasing action being characterized by a substantially smooth, single-transverse-mode intensity profile of said pump light across said output aperture.

4. The semiconductor optical amplifier of claim 3, said substantially smooth, spatially uniform intensity profile being characterized by an absence of higher-order transverse modes and an absence of current hot spots.

5. The semiconductor optical amplifier of claim 2, said plurality of VCSELs being integrated onto a common substrate and forming a linear array along said signal waveguide, said semiconductor optical amplifier further comprising separation zones positioned between each neighboring pair of VCSELs such that said VCSELs are electrically separated from each other.

6. The semiconductor optical amplifier of claim 5, wherein said linear array is a straight-line array.

7. The semiconductor optical amplifier of claim 5, wherein said separation zones are formed by an ion-implantation process that renders the ion-implanted material electrically non-conductive.

8. The semiconductor optical amplifier of claim 7, wherein there are at least 60 of said VCSELs positioned along said signal waveguide, and wherein each VCSEL results in not more than +1 dB of gain for the optical signal propagating therethrough.

9. The semiconductor optical amplifier of claim 8, wherein said current aperture of each of said VCSELs has a horizontal length not greater than about 10 $\mu$m in a direction of propagation of the optical signal and a horizontal width not greater than about 10 $\mu$m in a direction transverse to the direction of propagation of the optical signal.

10. The semiconductor optical amplifier of claim 9, wherein each of said separation zones has a horizontal length not greater than about 2 $\mu$m in the direction of propagation of the optical signal.

11. A vertically lasing semiconductor optical amplifier (SOA) for amplifying an optical signal, comprising:

an integrated plurality of vertical cavity surface emitting lasers (VCSELs) having a common gain medium layer, and a signal waveguide extending horizontally through the VCSELs near the gain medium layer such that the optical signal is amplified while propagating therethrough;

said VCSELs being functionally essentially isolated from each other, each building up its own lasing field, and each contributing only a small portion of an overall signal gain of said SOA;

wherein effects of a local defect in the operation of a given one of said VCSELs are limited to the small contribution of that VCSEL to the overall amplification of the optical signal by said SOA, with overall SOA performance being reduced by only a minor amount;

thereby achieving substantially smooth, single transverse mode lasing action of said VCSELLs for promoting spatially uniform and temporally stable gain of the optical signal as it propagates along the signal waveguide.

12. An SOA as in claim 11 in which the SOA comprises at least several dozen VCSELs, with any one of said VCSELs making a fractional contributing to the overall amplification of said optical signal, said fractional contribution corresponding to not more than the overall gain multiplied by the inverse of several dozen.

13. An SOA as in claim 11 in which the SOA comprises at least several hundred VCSELs and each makes a contribution to the overall amplification of the SOA that is no more than a hundredth of the overall amplification by the SOA.

14. A method of amplifying an optical, comprising:

providing a vertically lasing semiconductor optical amplifier (SOA) comprised of an integrated plurality of vertical cavity surface emitting lasers (VCSELs) having a common gain medium layer, and a signal waveguide extending horizontally through the VCSELs near the gain medium layer;

providing substantial electrical isolation between said VCSELs to cause each to build up its own lasing field during operation of said SOA contributing only a small portion of an overall signal gain of said SOA;

supplying an optical signal to an input of the SOA for amplification when propagating therethrough; and selecting operating parameters of said VCSELs to ensure that the contribution to each of the amplification of the optical signal by said SOA is small and effects of a local defect in the operation of a given one of said VCSELs are limited to the small contribution of that VCSEL to the overall amplification of the optical signal by said SOA, with overall SOA performance being reduced by only a minor amount;

thereby achieving substantially smooth, single transverse mode lasing action of said VCSELLs for promoting spatially uniform and temporally stable gain of the optical signal as it propagates along the signal waveguide.

15. A method as in claim 14 in which the providing comprises providing at least several dozen VCSELs, with any one of said VCSELs making a fractional contributing to the overall amplification of said optical signal, said fractional contribution corresponding to not more than the overall gain of the SOA multiplied by the inverse of several dozen.

16. A method as in claim 14 in which the providing comprises providing at least several hundred VCSELs, each making a contribution to the overall amplification of the SOA that is no more than a hundredth of the overall amplification by the SOA.

* * * * *